(12) United States Patent
Holmes et al.

(10) Patent No.: US 10,573,775 B1
(45) Date of Patent: Feb. 25, 2020

(54) BI CMOS PIXEL (71) Applicants: James A. Holmes, Fayetteville, AR (US); Matthew Francis, Elkins, AR (US)

(72) Inventors: James A. Holmes, Fayetteville, AR (US); Matthew Francis, Elkins, AR (US)

( * ) Notice: Subject to any disclaimer, the term of this patent is extended or adjusted under 35 U.S.C. 154(b) by 26 days.

(21) Appl. No.: 16/044,882

(22) Filed: Jul. 25, 2018

Related U.S. Application Data (60) Provisional application No. 62/536,581, filed on Jul. 25, 2017.

(51) Int. Cl.
| | | |
|---|---|---|
| H01L 31/11 | (2006.01) | |
| H01L 27/146 | (2006.01) | |
| H01L 31/02 | (2006.01) | |
| G01J 1/42 | (2006.01) | |
| G01J 1/44 | (2006.01) | |
| H01L 31/028 | (2006.01) | |

(52) U.S. Cl.
CPC .......... *H01L 31/1105* (2013.01); *G01J 1/429* (2013.01); *G01J 1/44* (2013.01); *H01L 27/14614* (2013.01); *H01L 27/14681* (2013.01); *H01L 31/028* (2013.01); *H01L 31/02019* (2013.01); *G01J 2001/4473* (2013.01)

(58) Field of Classification Search
CPC ... H01L 31/028–0288; H01L 31/0312–03125; H01L 31/1804–1824; H01L 31/11–1105; G01J 1/429; G01J 1/44
See application file for complete search history.

(56) References Cited

U.S. PATENT DOCUMENTS

| | | | |
|---|---|---|---|
| 3,504,181 A | 3/1970 | Chang et al. | 250/83.3 |
| 3,535,529 A | 10/1970 | Davidson | 250/211 |
| 5,093,576 A | 3/1992 | Edmond et al. | 250/370.01 |
| 5,459,332 A | 10/1995 | Carruthers | 257/17 |
| 5,670,784 A | 9/1997 | Cusack et al. | 250/372 |
| 6,064,053 A | 5/2000 | Chi | 250/208.1 |
| 6,344,663 B1 | 2/2002 | Slater, Jr. et al. | 257/77 |
| 8,723,990 B2 | 5/2014 | Hynecek | 348/248 |
| 9,368,537 B1 | 6/2016 | Holmes et al. | |
| 2010/0276699 A1 | 11/2010 | Zhao et al. | 257/76 |

*Primary Examiner* — Tucker J Wright
(74) *Attorney, Agent, or Firm* — Keisling & Pieper PLC; David B. Pieper (57) ABSTRACT

A bipolar complementary metal oxide semiconductor three transistor pixel with P-type metal-oxide-semiconductor base discharge and N-type metal-oxide-semiconductor emitter blocking.

3 Claims, 10 Drawing Sheets

BI CMOS PIXEL

CROSS-REFERENCE TO RELATED APPLICATIONS

This application claims priority to and is a continuation-in-part of U.S. provisional application Ser. No. 62/536,581 filed on Jul. 25, 2017 by Holmes et al. entitled BI CMOS PIXEL. Each of these prior applications is incorporated by reference in their entirety.

STATEMENT REGARDING FEDERALLY SPONSORED RESEARCH OR DEVELOPMENT

This invention was made with government support under (identify the contract) awarded by (identify the Federal agency). The government has certain rights in the invention.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in electrical circuits. More particularly, the invention relates to improvements particularly suited for bipolar pixels. In particular, the present invention relates specifically to a bicmos pixel also known as a bipolar complementary metal oxide semiconductor pixel.

2. Description of the Known Art

As will be appreciated by those skilled in the art, sensors and various silicon carbide devices are known in various forms. Patents disclosing various detectors and other information include: U.S. Pat. No. 9,368,537, issued to Holmes, et al. on Jun. 14, 2016 entitled Integrated silicon carbide ultraviolet sensors and methods; U.S. Pat. No. 3,535,529, issued to Davidson on Oct. 20, 1970 entitled Sensitive light sensor biased into the avalanche mode by means of a plurality of current sources; U.S. Pat. No. 3,504,181, issued to Hung Chi Chang et al. on Mar. 31, 1970 entitled Silicon carbide solid state ultraviolet radiation detector; U.S. Pat. No. 5,093,576, issued to Edmond et al. on Mar. 3, 1992 entitled High sensitivity ultraviolet radiation detector; U.S. Pat. No. 5,459,332, issued to Carruthers on Oct. 17, 1995, entitled Semiconductor photodetector device; U.S. Pat. No. 5,670,784, issued to Cusack et al. on Sep. 23, 1997 entitled High temperature gas stream optical flame sensor; U.S. Pat. No. 6,344,663, issued to Slater, Jr. et al. Feb. 5, 2002 entitled Silicon carbide CMOS devices; U.S. Pat. No. 8,723,990, issued to Hynecek on May 13, 2014 entitled Image pixel employing floating base readout concept, and image sensor and image sensor array including the image pixel; U.S. Pat. No. 6,064,053, issued to Chi on May 16, 2000 entitled Operation methods for active BiCMOS pixel for electronic shutter and image-lag elimination; and United States Application Publication No. 2010/0276699, filed by Zhao, and published on Nov. 4, 2010 entitled Silicon Carbide and Related Wide Bandgap Semiconductor Based Optically-Controlled Power Switching Devices. Each of these patents and publications is hereby expressly incorporated by reference in their entirety.

From these prior references it may be seen that these prior art patents are very limited in their teaching and utilization, and an improved bicmos pixel is needed to overcome these limitations.

SUMMARY OF THE INVENTION

The present invention is directed to an improved pixel using Bipolar Complementary Metal-Oxide Semiconductor topology with a silicon carbide ultraviolet light sensitive transistor to provide a bipolar complementary metal oxide semiconductor three transistor pixel with P-type metal-oxide-semiconductor base discharge and N-type metal-oxide-semiconductor emitter blocking. This provides an addressable pixel array with controllable operating characteristics. These and other objects and advantages of the present invention, along with features of novelty appurtenant thereto, will appear or become apparent by reviewing the following detailed description of the invention.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views:

FIG. 12b shows the linearization effect of the circuit of FIG. 12a.

DETAILED DESCRIPTION OF THE INVENTION

As shown in FIGS. 1-18 of the drawings, various circuits provide exemplary embodiments of the present invention. For this disclosure, "Terminals" are electrical terminals. Light is drawn as a terminal type of input #120 but the word terminal should be interpreted as an electrical terminal such as the electrical pads on the integrated circuit to make connections off-chip, to a package or board such as V+ or V−.

Figure 1:
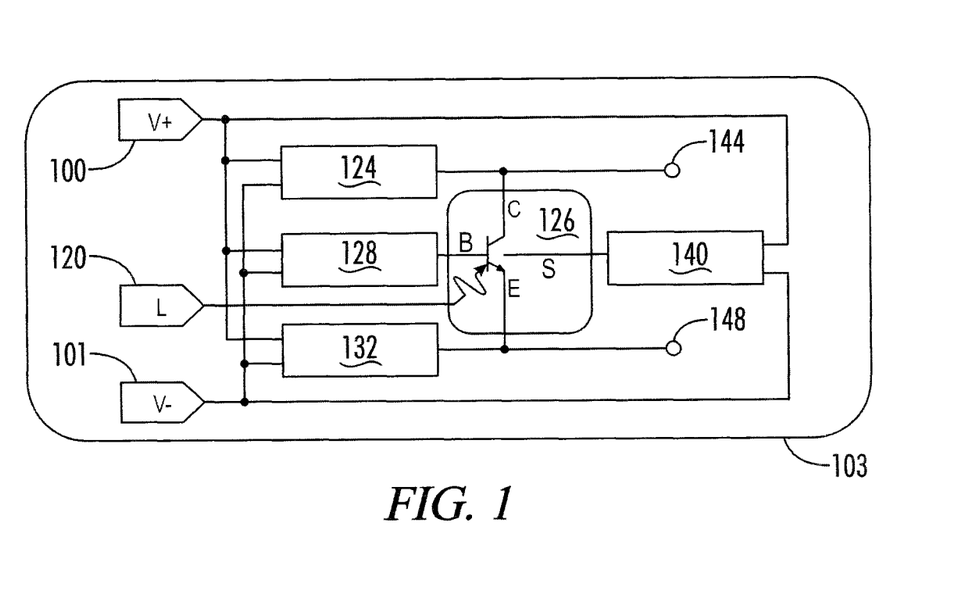
FIG. 1 is a schematic circuit diagram of a UV sensitive SiC lateral NPN in a generalized integrated circuit.

It is important to understand U.S. Pat. No. 9,368,537 which presents the general idea of a SiC lateral NPN being biased by circuits in the same chip as shown in FIG. 1. FIG. 1 is a circuit diagram of UV sensitive SiC lateral NPN in a generalized integrated circuit. One can build on this general idea to make UV-Photo-NPN Integrated Circuits, also referred to as Light-to-Current Transducers.

Figure 2:
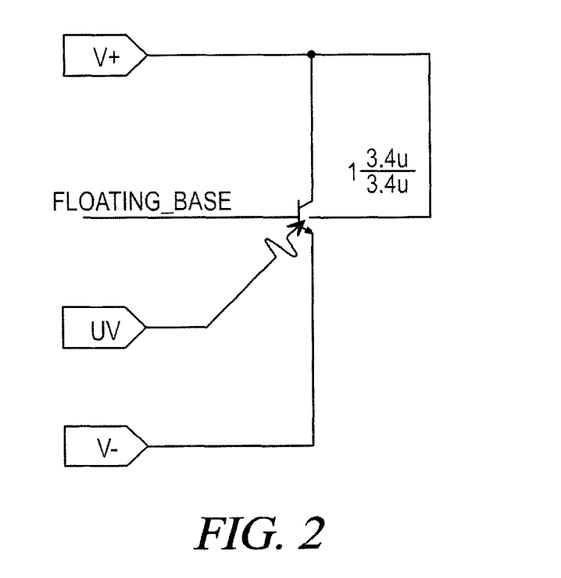
FIG. 2 is a schematic circuit diagram of a 4-Terminal SiC Lateral NPN configured as a 2 terminal UV sensor (low frequency apps).

FIG. 2 shows the simplest implementation of a Light-to-Current Transducer device in an integrated circuit where 124=short to V+, 128=open circuit, 132=short to V−, and 140=short to V+. This configures the 4-terminal transistor into a 2-terminal light-to-current transducer such as the UV photo-sensor as shown in FIG. 2. Photo-current in the Base-Emitter junction the NPN is amplified to the Collector-Emitter current flowing into V+ and out of V−. The floating base node enables fast turn-on response to UV light, but a slow turn-off response to the abrupt absence of UV light. The only effective current flowing into the base node is the photo-current, thus this in dark conditions the NPN is in cutoff. During the first few nanoseconds of exposure to UV light, the NPN passes from cutoff mode, through saturation mode into forward active mode. If exposure to UV light is abruptly removed, base charge dissipates slowly. Thus the NPN transitions slowly from forward active mode, through saturation mode, back into cutoff. Whereas the turn-on time constant is less than 1 micro second, the turn-off time is greater than a milli second for large devices. Regardless of the size of the device the turn-off time is generally 3 orders of magnitude, 1000×, longer than the turn-on time. This circuit is suitable for applications such as sunlight detection or health monitoring of continuously operating UV sources such as mercury lamps used in water or food purification. Since it has only two pads it takes up very little area and provides a high photo-current/cost ratio. Thus, FIG. 2 shows a 4-Terminal SiC Lateral NPN configured as a 2 terminal UV sensor for low frequency applications.

Figure 3:
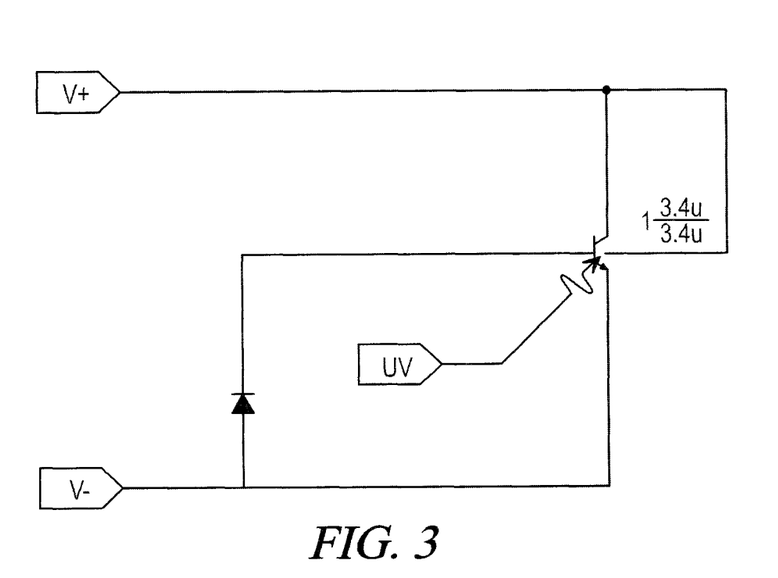
FIG. 3 is a schematic circuit diagram of a High frequency UV sensor, back ground UV (DC offset).

FIG. 3 shows an improvement over U.S. Pat. No. 3,535,529 issue to E. E. Davidson in 1970. This circuit improves the turn-off response time of the NPN by providing base discharge path through the reverse biased diode. This is essentially 124=short to V+; 128=diode cathode connected to NPN base, diode anode connected to NPN emitter; 132=short to V−; and 140=short to V+. A trade off of peak current output of −10% is made to reduce the turn-off time of the NPN by two orders of magnitude, around 500×. FIG. 3 transitions through all the same modes as in FIG. 2, but just does it faster. It has a diode integrated monolithically with the NPN. The steps from dark to light conditions are: (1) cutoff (2) saturation (3) forward-active; with the steps from light to dark conditions being: (3) forward-active (2) saturation (1) cutoff. This circuit is suitable as a receiver for fast changing digital UV signals such as UV light emitting diodes used to transmit digital signals across an air-gap or through a UV fiber. This is of particular interest for transmitting control signals from a conventional temperature range, defined as −55 to 125 C, to a high temperature electronics range of −55 to 600 C. Thus FIG. 3 shows a High frequency UV sensor, back ground UV, DC offset.

Figure 4:
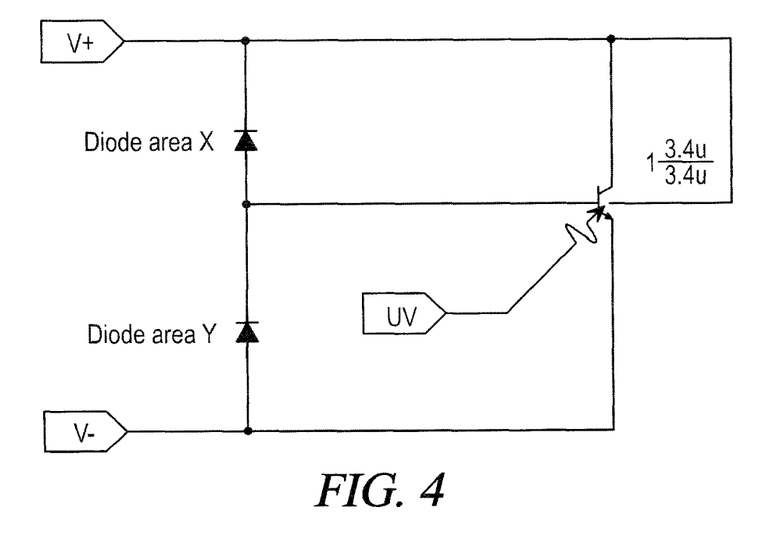
FIG. 4 is a schematic circuit diagram of a High frequency UV sensor electrically biased in forward-active mode.

FIG. 4 biases the NPN to act as a linear UV light transducer. The NPN is biased such that even when in dark conditions the NPN is already in forward-active mode. This is achieved by adding another reverse biased diode as shown in FIG. 4. Essentially this provides 124=short to V+; 128=diode Y cathode connected to NPN base, diode Y anode connected to NPN emitter; 128=diode x cathode connected V+, diode Y anode connected NPN base; 132=short to V−; and 140=short to V+. The reverse biased diodes create a high impedance voltage divider between V+ and V−. By adjusting ratio of the diode areas (X/Y>1), the base current of the NPN can be tuned for optimal linear operation. Thus, from dark to light conditions: The NPN is always in (3) forward-active mode; and from light to dark conditions: The NPN is always in (3) forward-active mode. Thus FIG. 4 shows a High frequency UV sensor electrically biased in forward-active mode. This circuit has applications for high bandwidth UV pulse detection. This circuit forms the basis for the diesel ignitions signature measurement. It is the right circuit to get pulses of light from flames, explosions, pulsed UV lasers and pulsed UV LEDs.

Figure 5:
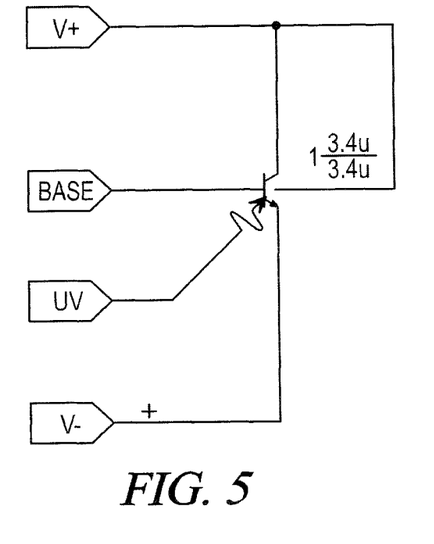
FIG. 5 is a schematic circuit diagram of a The three terminal Photo-transistor, similar products for VIS-IR available on the web.

For conventional-temperature applications there is a case to use the NPN just as a UV photo-NPN as shown in FIG. 5. FIG. 5 shows this as 3 terminal device/circuit in a 3-terminal package and users can effectively reproduce, the circuits shown in FIGS. 2, 3, and 4 with external components on a printed circuit board. For this embodiment 124=short to V+; 128=short to external pad; 132=short to V−; and 140=short to V+. Here FIG. 5 shows a three terminal Photo-transistor.

Figure 6:
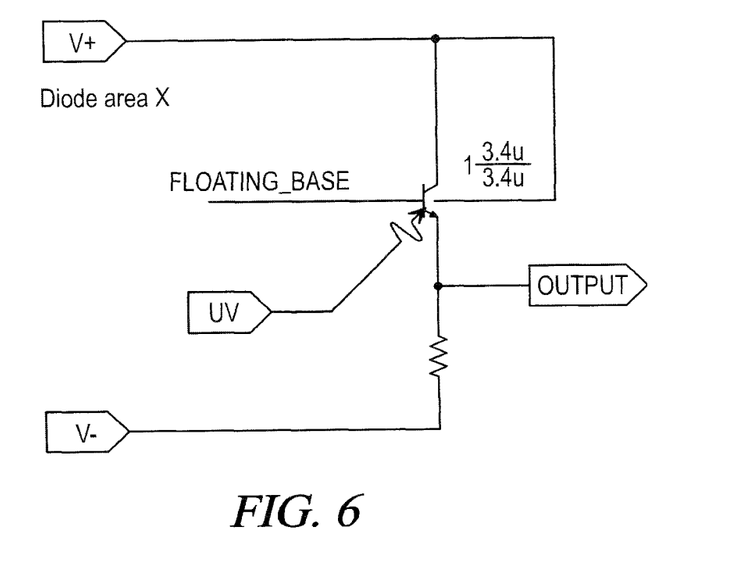
FIG. 6 is a schematic circuit diagram of a 3-Terminal light-to-voltage transducer IC based on a passive load (resistor) with time-constants as FIG. 1.

Next we can examine a UV-Photo-NPN Integrated Circuit for Light-to-Voltage with a Passive Load. Previous FIGS. 2-5 are light-to-current transducers. Integrating the light-current transducer with a load circuit makes the IC a light-to-voltage transducer. In its simplest form a resistive load is integrated with the UV photo-NPN to convert light to an output voltage as shown in FIG. 6 where 124=short to V+; 128=open circuit; 132=Resister positive terminal connected NPN base, resistor negative terminal connected to V−; and 140=short to V+. Thus, FIG. 6 shows a 3-Terminal light-to-voltage transducer IC based on a passive load, shown as a resistor, with time-constants as FIG. 1.

Figure 7:
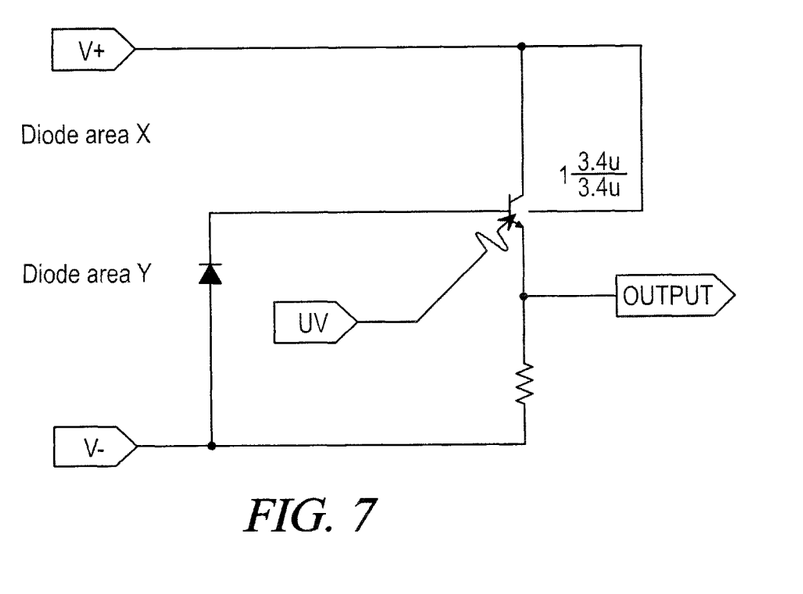
FIG. 7 is a schematic circuit diagram of a 3-Terminal Light-to-voltage transducer with reduced turn-off time.
Figure 8:
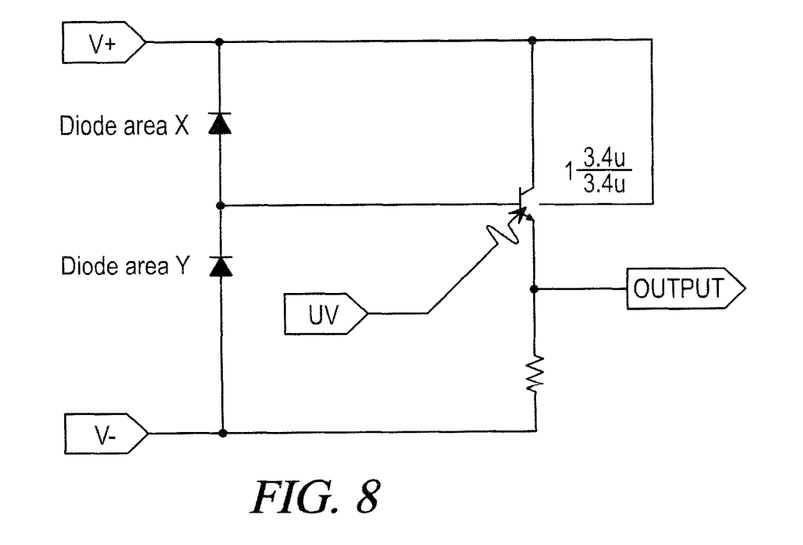
FIG. 8 is a schematic circuit diagram of a 3-Terminal Light-to-voltage transducer with linear output characteristic.

Following that same line of thought, the light-to-voltage transducers shown in FIG. 7 and FIG. 8 can have similar performance characteristics as their corresponding light-to-current transducers in FIG. 3 and FIG. 4. In FIG. 6, where 124=short to V+; 128=diode cathode connected to NPN base, diode anode connected to NPN emitter; 132=Resister positive terminal connected NPN base, resistor negative terminal connected to V−; and 140=short to V+. In figure that shows a 3-Terminal Light-to-voltage transducer with reduced turn-off time, the ratio of the diode areas (X/Y>1) determines the DC offset value at output. For FIG. 7, 124=short to V+; 128=diode Y cathode connected to NPN base, diode Y anode connected to NPN emitter; 128=diode x cathode connected V+, diode Y anode connected NPN base; 132=Resister positive terminal connected NPN base, resistor negative terminal connected to V−; and 140=short to V+. FIG. 8 then provides a 3-Terminal Light-to-voltage transducer with linear output characteristic.

Figure 9:
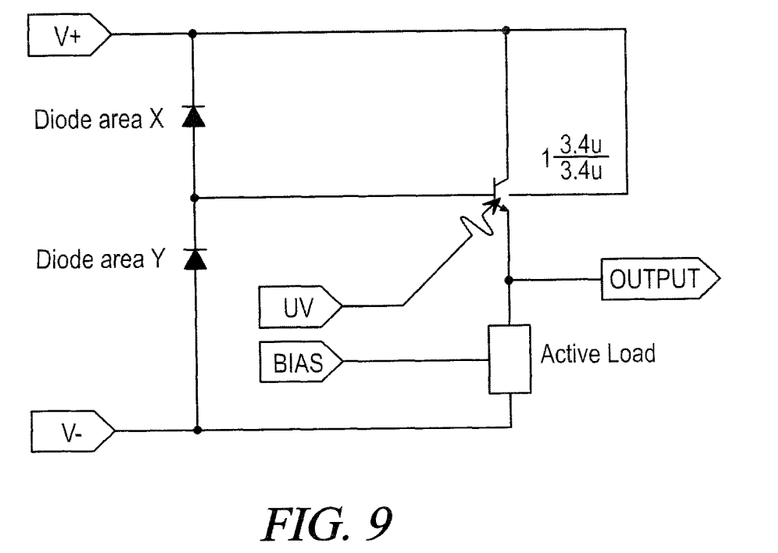
FIG. 9 is a schematic circuit diagram of a High bandwidth linear light-to-voltage transducer with integrated active load.

Next, we can look at a UV-Photo-NPN Integrated Circuit, also referred to as a Light-to-Voltage converter with an Active Load. The active loads provide a higher gain for transducing high-speed, small signal, light pulses at the cost of full scale voltage deflection. Consequently this circuit is well suited for extremely faint, spurious UV pulses such as UV photon counting, think Gieger mode, detection. See U.S. Pat. No. 3,535,529, issued to E. E. Davidson in 1970. For our FIG. 9 circuit 124=short to V+; 128=diode Y cathode connected to NPN base, diode Y anode connected to NPN emitter; 128=diode x cathode connected V+, diode Y anode connected NPN base; 132=Active load between NPN emitter and V−; and 140=short to V+. Thus, FIG. 9 shows a High bandwidth linear light-to-voltage transducer with integrated active load.

Figure 10:
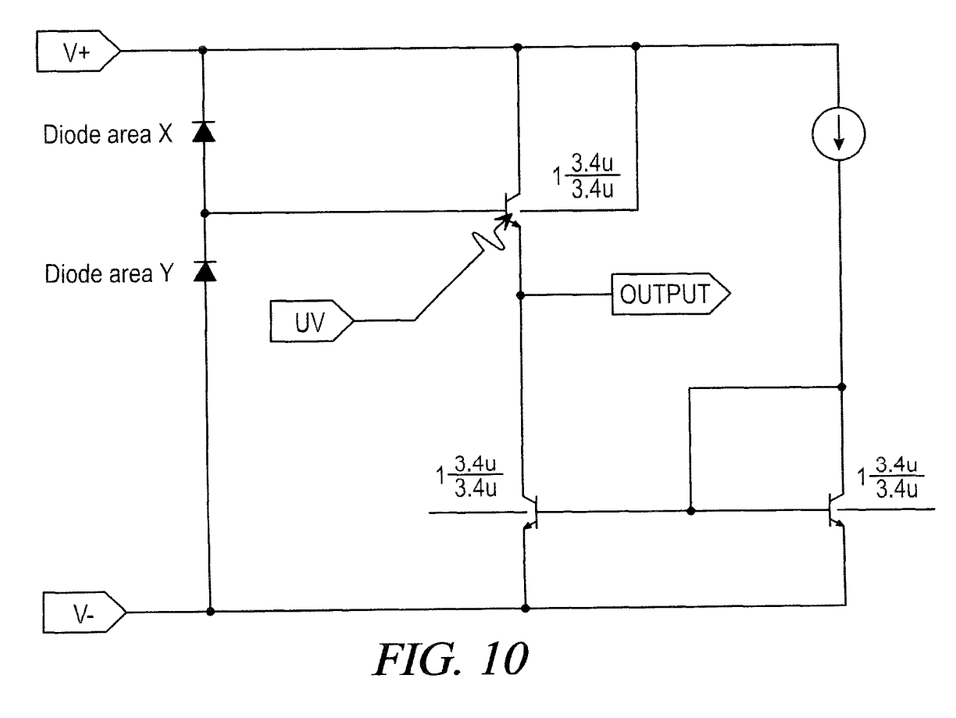
FIG. 10 is a schematic circuit diagram of a Light-to-voltage transducer with (text book) bipolar current mirror as active load.
Figure 11:
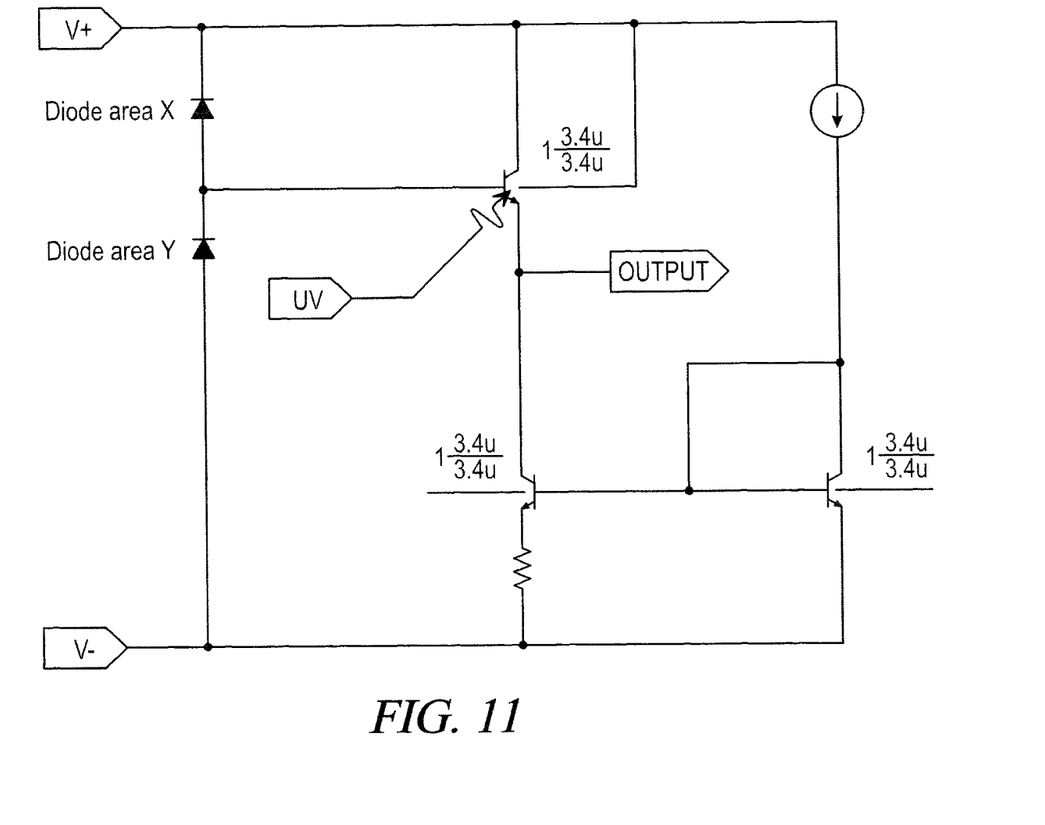
FIG. 11 is a schematic circuit diagram of a Light-to-voltage transducer with (text book) Widlar current mirror as active load.
Figure 12A:
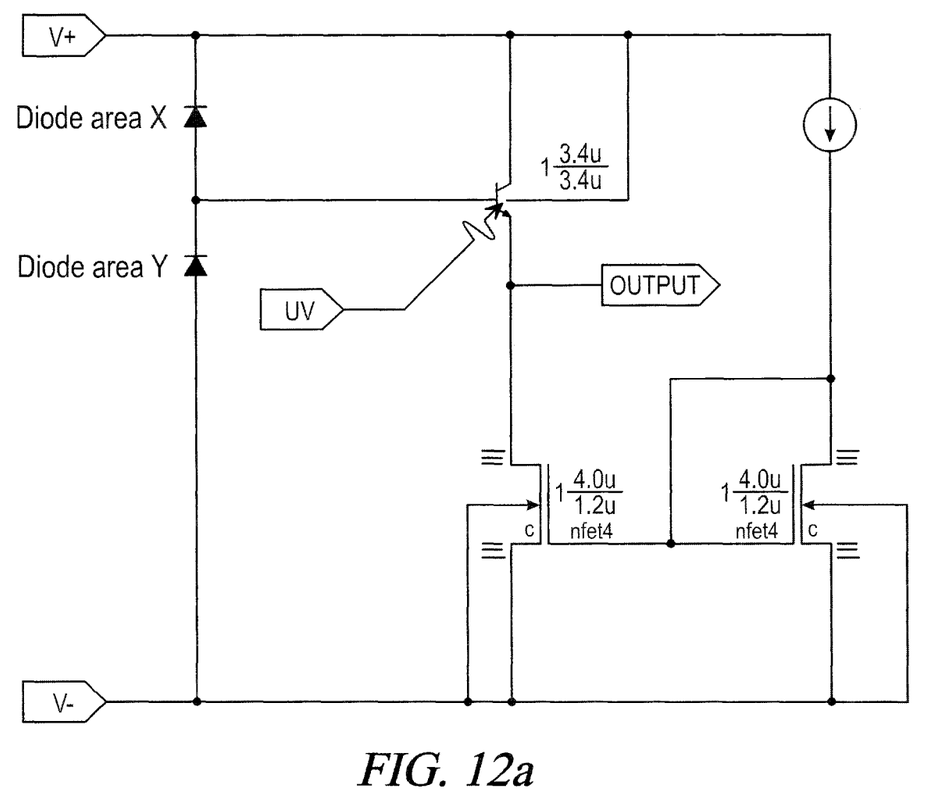
FIG. 12a is a schematic circuit diagram of a Light-to-voltage converter with (text book) NMOS current mirror as active load, this is the first BiCMOS circuit introduced thus far.

The following provide implementations of an active load for the light-to-voltage transducer. Specifically: The simple bipolar mirror in FIG. 10; The Widlar mirror in FIG. 11; and the NMOS current mirror in FIG. 12 where the significance is this is a BiCMOS integrated circuit. There are many other active loads in the literature that can be applied to enhance the small-signal voltage gain of the light-to-voltage transducer. Thus, FIG. 10 shows a Light-to-voltage transducer with a bipolar current mirror as active load. FIG. 11 shows a Light-to-voltage transducer with a Widlar current mirror as active load.

Figure 12B:
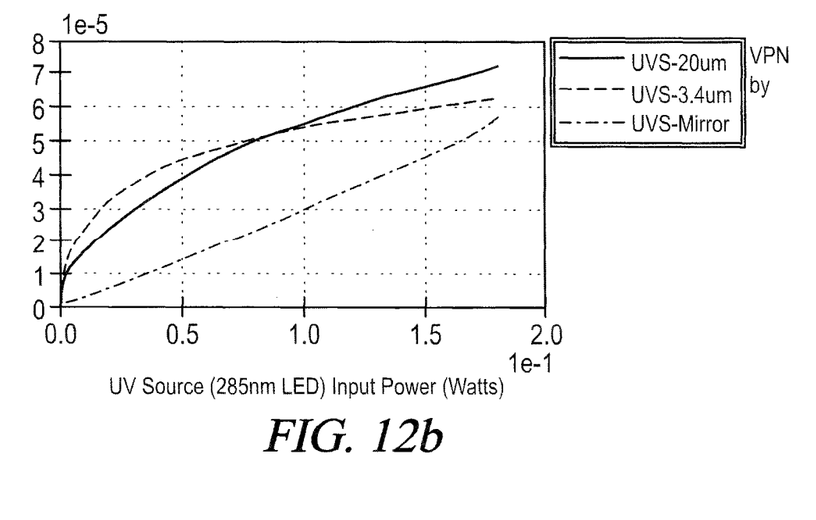

In FIGS. 1 through 11, the SiC process could be a purely bipolar process. In FIG. 12, the NMOS current mirror implies the integrated circuit can have both bipolars and MOSFETS. This is significant because it a BiCMOS circuit. BiCMOS is an evolved semiconductor technology that, integrates two formerly separate semiconductor technologies, those of the bipolar junction transistor and the CMOS transistor, in a single integrated circuit device. FIG. 12a shows a Light-to-voltage converter with NMOS current mirror as active load, this is the first BiCMOS circuit introduced thus far. FIG. 12b shows the current mirror effect of the electrical circuit of FIG. 12a on linearization. When referring to the right end of the traces, the top and middle traces are two different sized UV-NPN output currents when biased stand-alone. The bottom trace is the output current of UV-NPN linearized by the NMOS current mirror presented as the two transistors at the bottom of FIG. 12.

Figure 13:
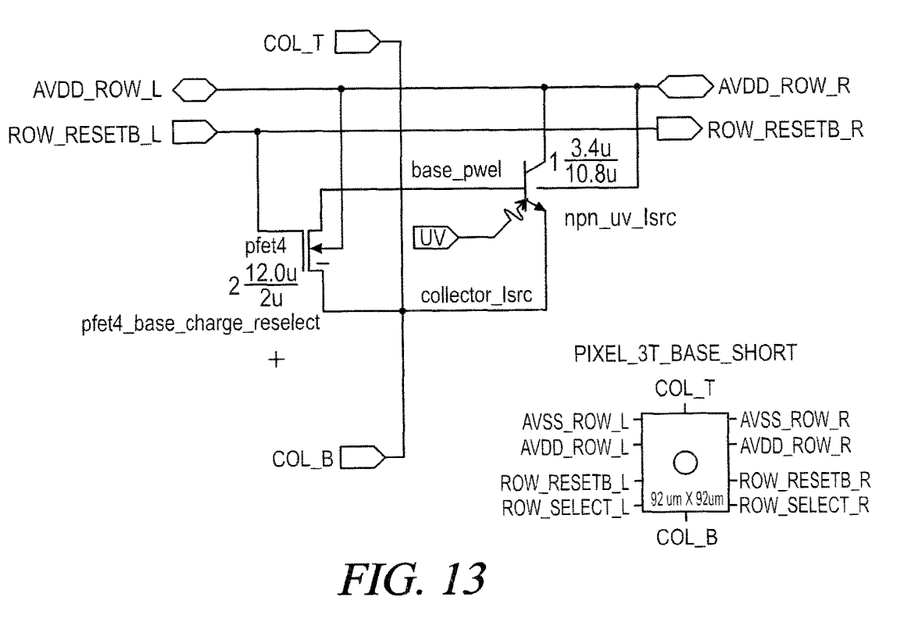
FIG. 13 is a schematic circuit diagram of a 2-Transistor Pixel with PMOS control of NPN.

This basis can be further improved upon by creating UV Pixels for Addressable Light-to-Current circuitry. Pixels are circuits that can be addressed by digital control circuitry. Pixels are typically tiled to create an array of samples. Using the known X, Y, dimensions, they can be tiled in the X direction to create columns, then tiled in the Y direction to create rows, to construct a 2-dimensional array. By making the pixel as small as possible, the resolutions of the array increase and cost per pixel decreases. Consequently, it is desirable to use as few devices in each pixel as possible. Low power digital circuits are best implemented with MOS devices since they have low quiescent power dissipation. The simplest way to address the light-to-current transducing NPN is to short the base-emitter junction of the NPN with PMOS transistor as shown in FIG. 13 where 124=short to V+; 128=PMOS source connected NPN base, PMOS drain connected to NPN emitter; 132=short to V−; and 140=short to V+. When the gate of the PMOS is driven low, the PMOS transistor turns on, shorting the NPN base to NPN emitter. This drives the NPN into cut-off. Any photo-current is dissipated in the PMOS drain-to-source resistance. This topology accomplishes two functions at once, it turns the NPN off and discharges the base node, thus any history of light transduction, think memory, is removed and any base charging due emitter-base leakage is removed. Conversely, when the PMOS gate is driven high, the PMOS transistor turns off. The NPN is effective a floating base and photo-current drives the NPN out of cut-off into saturation turning the NPN on. This allows the terminal "ROW_RESETB" to function as an active-low shutter control. Applications of the pixel are in UV imaging systems that need to operate at high speeds. Thus, FIG. 13 shows a 2-Transistor Pixel with PMOS control of NPN.

Figure 14:
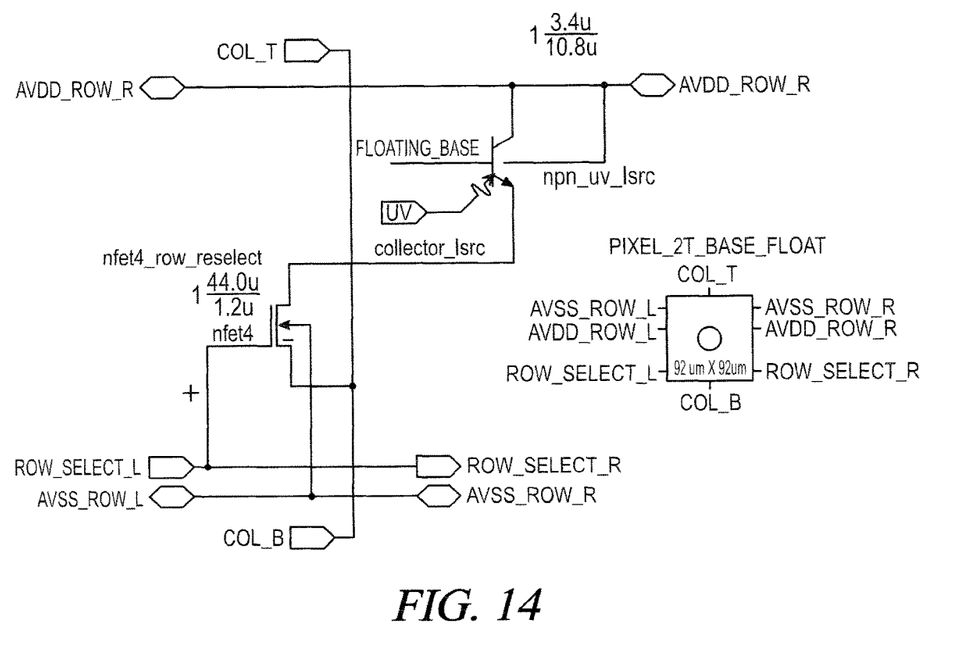
FIG. 14 is a schematic circuit diagram of a 2-Transistor Pixel with NMOS gating NPN emitter.

Alternatively, there are cases where photo-current history is desirable such as in applications requiring long exposure times such as UV astronomy. For these applications, the base is floating. A mechanical shutter exposes the pixel for long periods of time to very faint sources such as star light. The NMOS gate is driven high turning on the NMOS. This allows NPN emitter current to flow. When the NMOS gate is driven low, the NPN current is blocked. For FIG. 14 we have 124=short to V+; 128=open circuit; 132=NMOS drain connected NPN emitter, NMOS source connected to V−; and 140=short to V+. Thus, FIG. 14 shows a 2-Transistor Pixel with NMOS gating NPN emitter.

Now we can look at 3-Transistor pixel that can be used to provide high speed electronic shutter control and to reduce collect-emitter leakage current. This provides an advantage for large arrays where the leakage current from the NPN degrade the contrast ratio of the image. By using both the PMOS to drive the NPN into cut-off, and the NMOS to gate emitter current as shown in FIG. 15, the contrast ratio of a large array is improved.

Figure 15:
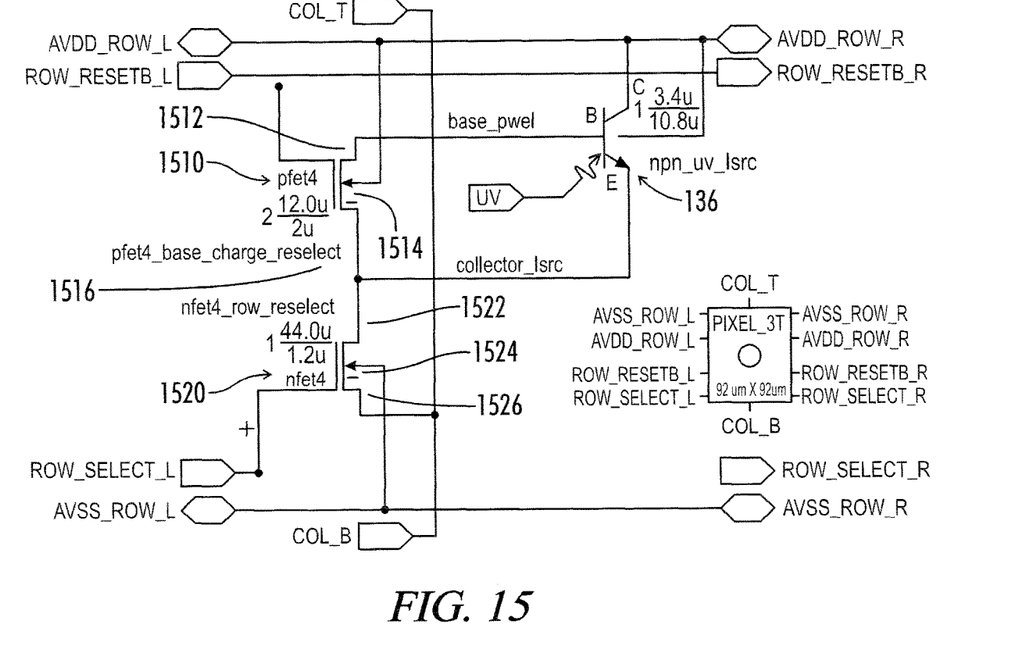
FIG. 15 is a schematic circuit diagram of a 3-Transistor Pixel with PMOS base discharge and NMOS emitter blocking.

FIG. 15 shows a bipolar npn type ultraviolet light sensitive silicon carbide transistor 136 with a npn base B and a npn emitter E; a p type metal oxide semiconductor field effect transistor 1510 including a pmos source 1512, pmos gate 1514, and a pmos drain 1516; and an n type metal oxide semiconductor field effect transistor 1520 including a nmos drain 1522, nmos gate 1524, and an nmos source 1526. The pmos source 1512 is connected to the npn base B. The pmos drain 1516 is connected to the npn emitter E, and the nmos drain 1522 is connected to the npn emitter E. This 3-Terminal pixel has been proven in a 64×159 pixel array in UV imaging ASIC. For FIG. 15, 124=short to V+; 128=PMOS source connected NPN base, PMOS drain connected to NPN emitter; 132=NMOS drain connected NPN emitter, NMOS source connected to V−; and 140=short to V+. Thus, FIG. 15 shows a 3-Transistor Pixel with PMOS base discharge and NMOS emitter blocking.

Figure 16:
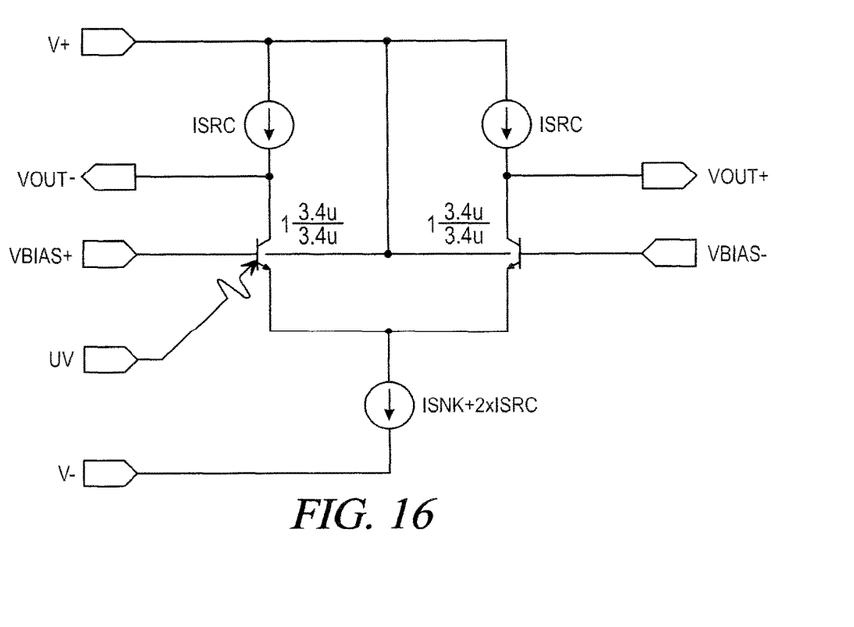
FIG. 16 is a schematic circuit diagram of a Light-to-Voltage Conversion Using Common Emitter NPN Differential Pair Amplifier.
Figure 17:
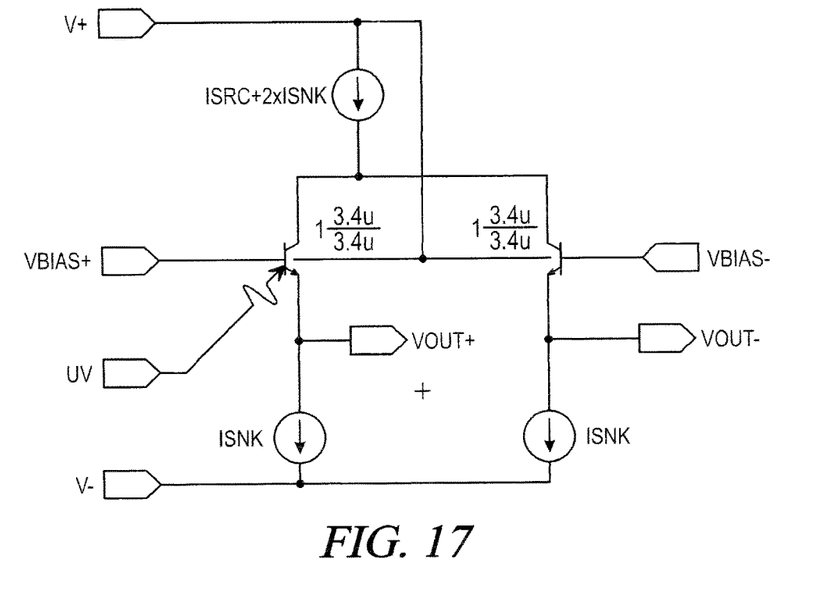
FIG. 17 is a schematic circuit diagram of a Light-to-Voltage Conversion Using Common Collector NPN Differential Pair Amplifier.

Next, we can look at a High-Gain, High Linearity Differential Pair with Additive Manufacturing. Light-to-voltage conversion can be further amplified with a differential pair amplifier. Two NPS are biased in a differential pair amplifier gain stage in a common emitter configuration as shown in FIG. 16 and in the common collector configuration in FIG. 17. Identical current sources provide currents of ISRC to each the collectors of the differential pair. A single "tail-current" sink is connected to the emitters of the differential pair. The tail current sink is equal to the combined value of the current sources to satisfy Kirchhoff's current law at the current summing node which is the common emitter FIG. 16 in and common collector in FIG. 17. The NPNS are both biased in forward-active mode to amplify small differences in their base currents. One NPN is exposed to UV light. The other NPN is covered with UV blocking/absorbing material to prevent UV light from reaching the transistor. This light/dark differential creates the input signal for the differential pair. The UV blocking material is applied after the integrated circuit is manufactured using computer controlled printing method such as precision controlled dispensers or aerosol ink jet printing methods. Thus, FIG. 16 shows a Light-to-Voltage Conversion Using Common Emitter NPN Differential Pair Amplifier and FIG. 17 shows a Light-to-Voltage Conversion Using Common Collector NPN Differential Pair Amplifier.

Figure 18:
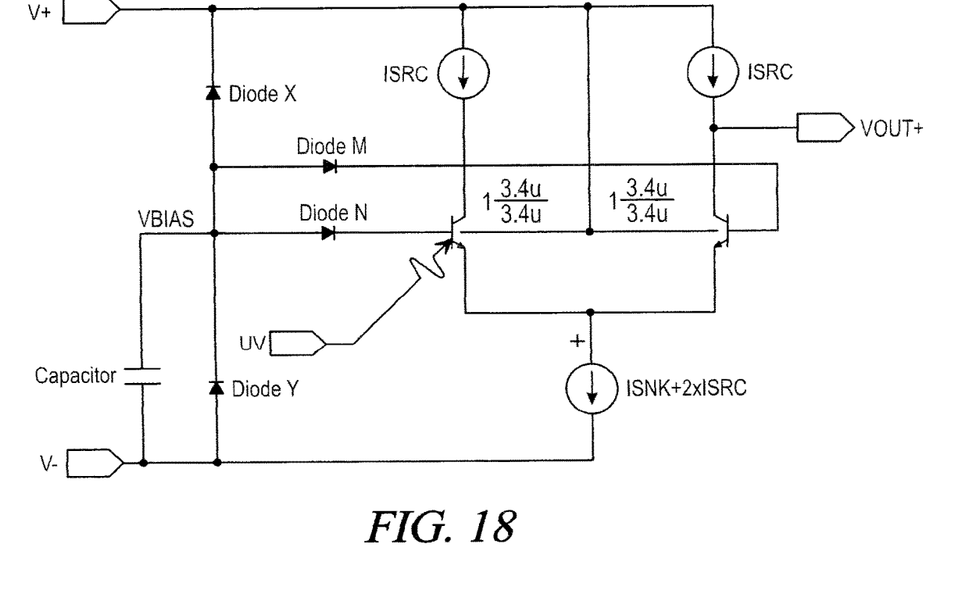
FIG. 18 is a schematic circuit diagram of a Low-Current Input Bias Network for UV Differential Pair Amplifier.

FIG. 18 then shows an integrated low-DC-bias input current network for the common-emitter input pair. The ratio of the areas of diodes X and Y create a high impedance voltage divider at node VBIAS. The capacitor provides power supply noise suppression. Diode N and Diode M are sized identically to create current divider to bias the NPNs in forward active mode. Photo-currents in the exposed NPN create a differential voltage that is amplified by the differential pair. This low-current input-bias topology can be used for both common-emitter and common-collector differential pair amplifiers. Thus, FIG. 18 shows a Low-Current Input Bias Network for UV Differential Pair Amplifier.

Reference numerals used throughout the detailed description and the drawings correspond to the following elements:
Base connection B
Emitter connection E
Collector connection C
Substrate connection S
Package connection 100, 101
biasing circuitry 103
ultraviolet light 120
collector bias circuit 124
base bias circuit 128
emitter bias circuit 132
ultraviolet sensitive silicon carbide bipolar transistor 136
substrate bias circuit 140
collector output node 144
emitter output node 148
p type metal oxide semiconductor field effect transistor 1510
pmos source 1512
pmos gate 1514
pmos drain 1516
n type metal oxide semiconductor field effect transistor 1520
nmos drain 1522
nmos gate 1524
nmos source 1526

From the foregoing, it will be seen that this invention well adapted to obtain all the ends and objects herein set forth, together with other advantages which are inherent to the structure. It will also be understood that certain features and subcombinations are of utility and may be employed without reference to other features and subcombinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' having,' or 'including' should be interpreted as open ended claim language that allows additional elements or structures. Finally, where the claims recite "a" or "a first" element of the equivalent thereof, such claims should be understood to include incorporation of one or more such elements, neither requiring nor excluding two or more such elements.

What is claimed is:

1. A three transistor ultraviolet light sensor pixel comprising:
   a bipolar npn type ultraviolet light sensitive silicon carbide transistor with a npn base and a npn emitter;
   a p type metal oxide semiconductor field effect transistor including a pmos source and a pmos drain;
   an n type metal oxide semiconductor field effect transistor including a nmos drain;
   the pmos source connected to the npn base,
   the pmos drain connected to the npn emitter, and
   the nmos drain connected to the npn emitter.

2. A three transistor ultraviolet light sensor pixel comprising:
   a bipolar ultraviolet light sensitive silicon carbide transistor with a base and an emitter;
   a first metal oxide semiconductor field effect transistor including a first source and a first drain;
   a second metal oxide semiconductor field effect transistor including a second drain;
   the first source connected to the base,
   the first drain connected to the emitter, and
   the second drain connected to the emitter.

3. A three transistor ultraviolet light sensor pixel comprising:
   a first ultraviolet light sensitive silicon carbide transistor with a base and an emitter;
   a first field effect transistor including a first source and a first drain;
   a second field effect transistor including a second drain;
   the first source connected to the base,
   the first drain connected to the emitter, and
   the second drain connected to the emitter.

* * * * *